(12) United States Patent
Wang et al.

(10) Patent No.: US 9,397,067 B2
(45) Date of Patent: Jul. 19, 2016

(54) BONDING DEVICE

(71) Applicants:FU DING ELECTRONICAL TECHNOLOGY (JIASHAN) CO., LTD., Zhejiang (CN); HON HAI PRECISION INDUSTRY CO., LTD., New Taipei (TW)

(72) Inventors: Ding-Xiang Wang, Jiashan (CN); Heng Duan, Jiashan (CN)

(73) Assignees: FU DING ELECTRONICAL TECHNOLOGY (JIASHAN) CO., LTD., Zhejiang (CN); HON HAI PRECISION INDUSTRY CO., LTD., New Taipei (TW)

( * ) Notice: Subject to any disclaimer, the term of this patent is extended or adjusted under 35 U.S.C. 154(b) by 249 days.

(21) Appl. No.: 14/106,865

(22) Filed: Dec. 16, 2013

(65) Prior Publication Data

US 2014/0182789 A1  Jul. 3, 2014

(30) Foreign Application Priority Data

Dec. 27, 2012 (CN) ...................... 2012 2 7314222 U (51) Int. Cl.
| | |
|---|---|
| H01L 21/48 | (2006.01) |
| B32B 37/12 | (2006.01) |
| B29C 65/78 | (2006.01) |
| H01L 23/00 | (2006.01) |
| B32B 37/00 | (2006.01) |
| F16B 11/00 | (2006.01) |
| B32B 37/04 | (2006.01) |
| B29L 31/34 | (2006.01) |

(52) U.S. Cl.
CPC ............ *H01L 24/80* (2013.01); *B29C 65/7805* (2013.01); *B29C 65/7864* (2013.01); *B32B 37/0046* (2013.01); *B29L 2031/3481* (2013.01); *F16B 11/006* (2013.01); *Y10T 156/1744* (2015.01)

(58) Field of Classification Search
CPC ................. B29L 2031/3481; Y10T 156/1744; Y10T 156/17; F16B 11/006; H01L 21/48; B29C 65/78–65/7879; B29C 66/47; B29C 66/472; B32B 37/0046
USPC ........................................................ 438/106
See application file for complete search history.

(56) References Cited

U.S. PATENT DOCUMENTS 4,231,835 A * 11/1980 Ensley ................. B65H 23/032
156/361
4,890,763 A * 1/1990 Curiel .................... B65D 25/34
206/459.1

(Continued)

*Primary Examiner* — Sonya Mazumdar
(74) *Attorney, Agent, or Firm* — ScienBiziP, P.C.

(57) ABSTRACT

A bonding device includes a first feeding mechanism, a second feeding mechanism, a glue spraying mechanism positioned between the first feeding mechanism and the second feeding mechanism, and a bonding mechanism. The first feeding mechanism comprises a mounting frame and a transmission belt mounted on the mounting frame. The second feeding mechanism includes a support frame, a feeding member positioned on the support frame, a positioning plate mounted on the support frame and located below the feeding member, and a first driver connected to the positioning plate. The feeding member vertically defines at least one feeding groove. The positioning plate defines a matching groove matching with the first workpiece The bonding mechanism includes a second driver and a suction member connected to the second driver.

18 Claims, 6 Drawing Sheets

(56) References Cited

U.S. PATENT DOCUMENTS

| | | | | |
|---|---|---|---|---|
| 4,951,388 A * | 8/1990 | Eguchi | ............... | H05K 13/046 156/497 |
| 5,336,357 A * | 8/1994 | Layher | ............... | H05K 13/0408 156/285 |
| 5,614,118 A * | 3/1997 | Weber | ............... | B23C 65/203 219/243 |
| 6,206,066 B1 * | 3/2001 | Imanishi | ............... | H01L 21/563 156/356 |
| 2002/0004980 A1 * | 1/2002 | Onitsuka | ............... | H05K 31/0469 29/832 |
| 2003/0070280 A1 * | 4/2003 | Katano | ............... | B23Q 7/1473 29/563 |
| 2008/0128081 A1 * | 6/2008 | Wang | ............... | H01L 21/6838 156/285 |
| 2009/0283220 A1 * | 11/2009 | Chen | ............... | B65H 37/04 156/566 |
| 2012/0043005 A1 * | 2/2012 | Yamakami | ............... | H01L 24/75 156/60 |

\* cited by examiner

BONDING DEVICE

BACKGROUND

1. Technical Field

The present disclosure relates to bonding devices, and particularly to an automatic bonding device.

2. Description of Related Art

In bonding electronic components, two workpieces need to be bonded together. When in bonding, adhesive is manually coated on one workpiece, and then an another workpiece is adhered to the aforementioned workpiece. However, manually bonding of the workpieces wastes a large amount of labor and time, and the corresponding cost is high. In addition, a bonding accuracy of the workpieces is relatively low.

Therefore, there is room for improvement in the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
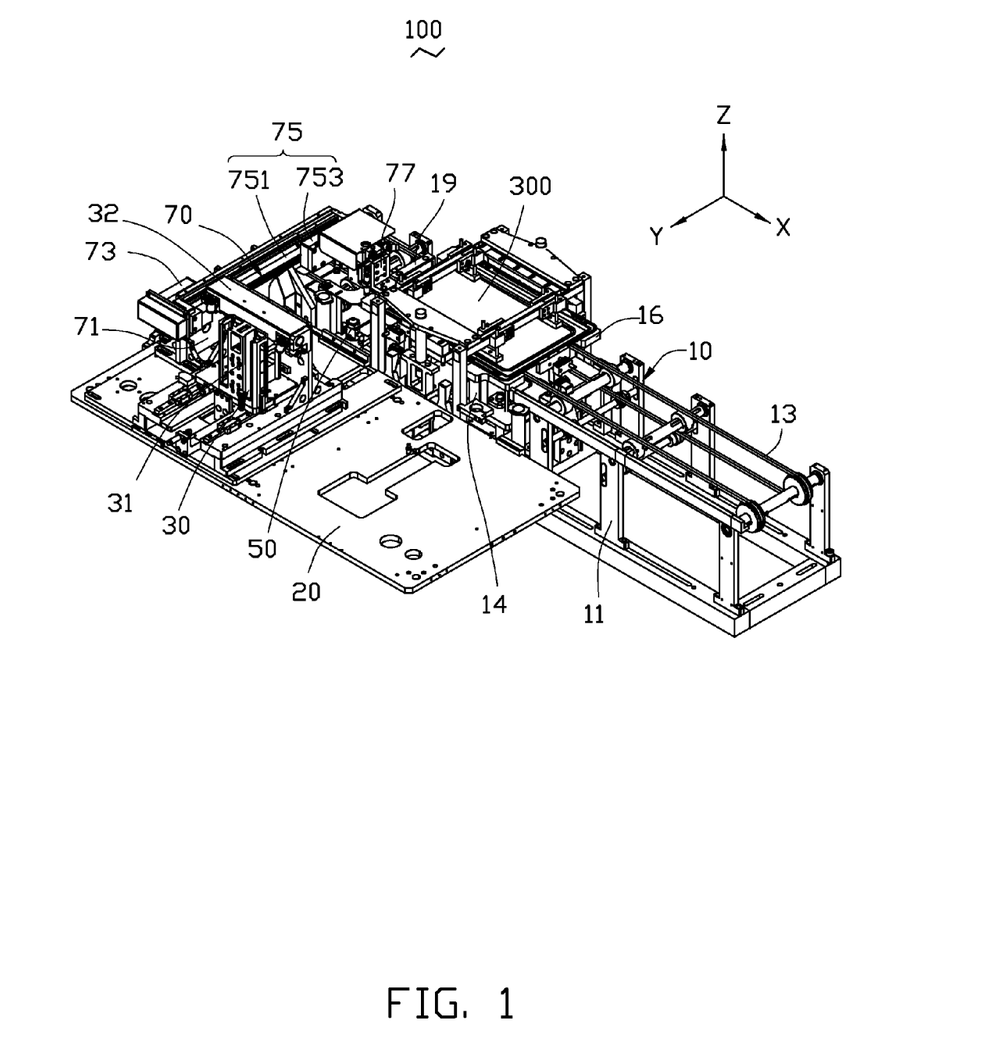
FIG. 1 is an assembled, isometric view of an embodiment of a bonding device including a first feeding mechanism, a second feeding mechanism, and a bonding mechanism.

FIG. 1 shows one embodiment of a bonding device 100, for bonding a first workpiece 200 (shown in FIG. 4) to a second workpiece 300. The bonding device 100 includes a first feeding mechanism 10, a mounting platform 20, a second feeding mechanism 30, a glue spraying mechanism 50, and a bonding mechanism 70. The first feeding mechanism 10 is configured to feed the second workpiece 300 to a preset bonding position. The mounting platform 20 is located beside the first feeding mechanism 10. The second feeding mechanism 30 is mounted on the mounting platform 20, and is configured to feed the first workpiece 200 to the second workpiece 300. The glue spraying mechanism 50 is mounted on the mounting platform 20, and is located between the first feeding mechanism 10 and the second feeding mechanism 30, for spraying a glue or a bonding adhesive at the first workpiece 200. The bonding mechanism 70 is mounted on the mounting platform 20, and is located at a same side of the first feeding mechanism 10, the second feeding mechanism 30, and the glue spraying mechanism 50. The bonding mechanism 70 is configured to clamp the first workpiece 200 to the glue spraying mechanism 50, and adhere or bond the first workpiece 200 to the second workpiece 300 after the glue spraying mechanism 50 has sprayed glue to the first workpiece 200. In the illustrated embodiment, the first workpiece 200 is a substantially L-shaped strengthening or reinforcement sheet. The second workpiece 300 is a housing of an electronic device.

Figure 2:
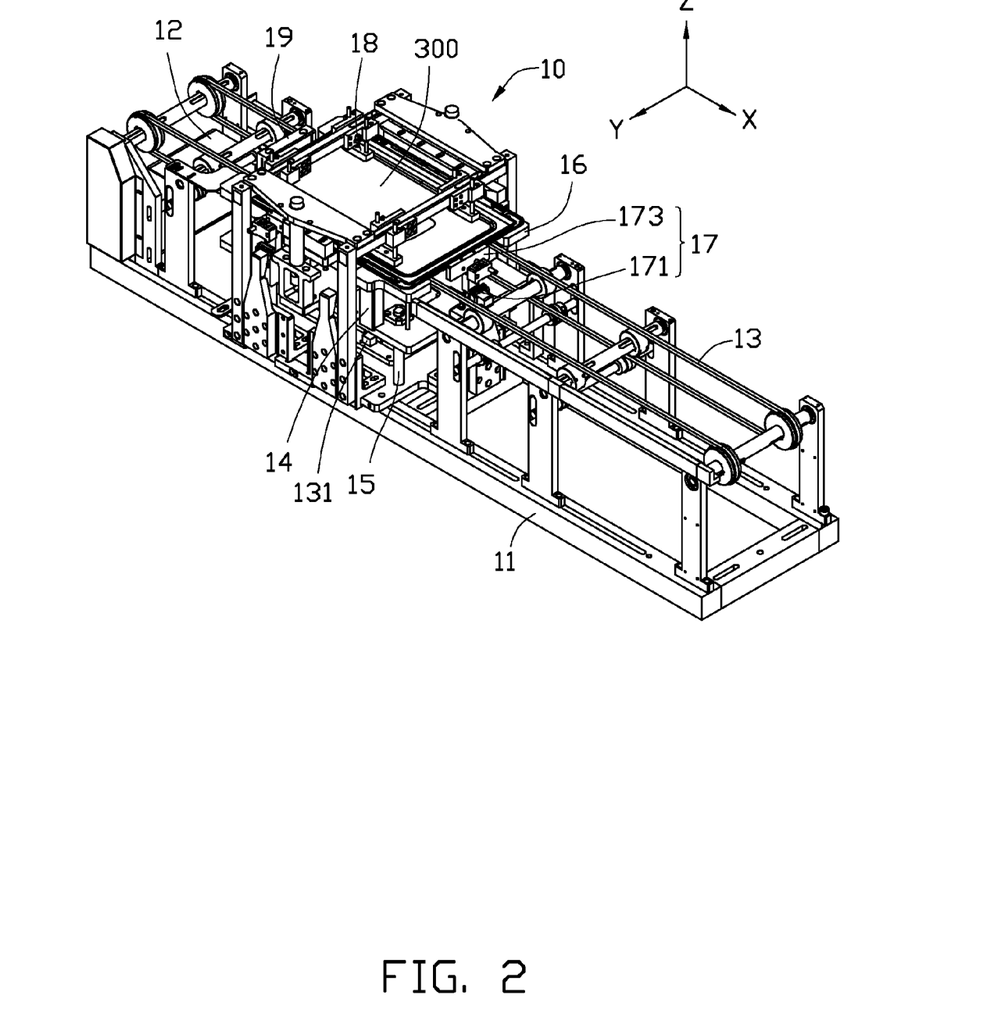
FIG. 2 is an assembled, isometric view of the first feeding mechanism shown in FIG. 1.

FIG. 2 shows the first feeding mechanism 10 includes a mounting frame 11, a motor 12, a transmission belt 13, a telescopic driver 131, a fixing frame 14, a guiding member 15, a positioning tool 16, a first positioning member 17, four pressing members 18, and a resisting block 19. The mounting frame 11 is substantially a rectangular frame, and is arranged along a direction X. The motor 12 is mounted at an end of the mounting frame 11. The transmission belt 13 is wound on the mounting frame 11 along the direction X. The motor 12 moves the transmission belt 13 along an opposite direction of the direction X, such that the second workpiece 300 positioned on the transmission belt 13 moves from an end of the mounting frame 11 to an opposite end of the mounting frame 11 along the opposite direction of the direction X.

The telescopic driver 131 is received in the mounting frame 11. In the illustrated embodiment, the telescopic driver 131 is a telescopic cylinder. The fixing frame 14 is mounted in the mounting frame 11 above the telescopic driver 131. The telescopic driver 131 moves the fixing frame 14 vertically. The guiding member 15 is substantially a rod movably-inserted through the fixing frame 14 and is received in the mounting frame 11 along a direction Z which is perpendicular to the direction X, for guiding the fixing frame 14 when being moving vertically. The positioning tool 16 is mounted on top of the fixing frame 14, and a top surface of the positioning tool 16 matches with the second workpiece 300, for receiving the second workpiece 300.

The first positioning member 17 includes a first driving body 171 and a first positioning end 173 connected to the first driving body 171. The first driving body 171 is mounted on the fixing frame 14, and is located at a side of the positioning tool 16 away from the motor 12. The first positioning end 173 is formed on the first positioning body 171, and is adjacent to the positioning tool 16. The first driving body 171 drives the first positioning end 173 to move along the opposite direction from the direction X, such that the second workpiece 300 is positioned by the first positioning end 173 in the positioning tool 16. The four pressing members 18 are mounted on the mounting frame 11, and located above substantially four corners of the positioning tool 16, respectively. Each pressing member 18 includes a spring (not shown) engaged therein, such that each pressing member 18 is capable of elastically pressing the second workpiece 300 received in the positioning tool 16 along the direction Z. The resisting block 19 is mounted on the mounting frame 11 adjacent to the motor 12, for blocking the second workpiece 300 transported on the transmission belt 13.

FIGS. 1, and 3 through 5 show the mounting platform 20 positioned at a side of the mounting frame 11 of the first feeding mechanism 10. The second feeding mechanism 30 is mounted on the mounting platform 20, and includes a support frame 31, a horizontal driving member 32, a feeding member 33, a pair of guiding rails 34, a positioning plate 35, a second positioning member 36, a third positioning member 37, and a first driver 38. The support frame 31 is fixed on the mounting platform 20, and includes a first support portion 311 and a second support portion 313. The first support portion 311 is fixed on the mounting platform 20, and a receiving room 315 is defined between the first support portion 311 and the mounting platform 20, for receiving the first driver 38. The first support portion 311 defines a sliding groove 316 along a direction Y which is perpendicular to the direction X and the direction Z, respectively. The second support portion 313 is perpendicularly positioned on the first support portion 311, and parallel with the direction X and the direction Z. The second support portion 313 defines an opening 317 (shown in FIG. 5) at a bottom end thereof, for allowing the pair of guiding rails 34 and the positioning plate 35 to be inserted therethrough.

Figure 3:
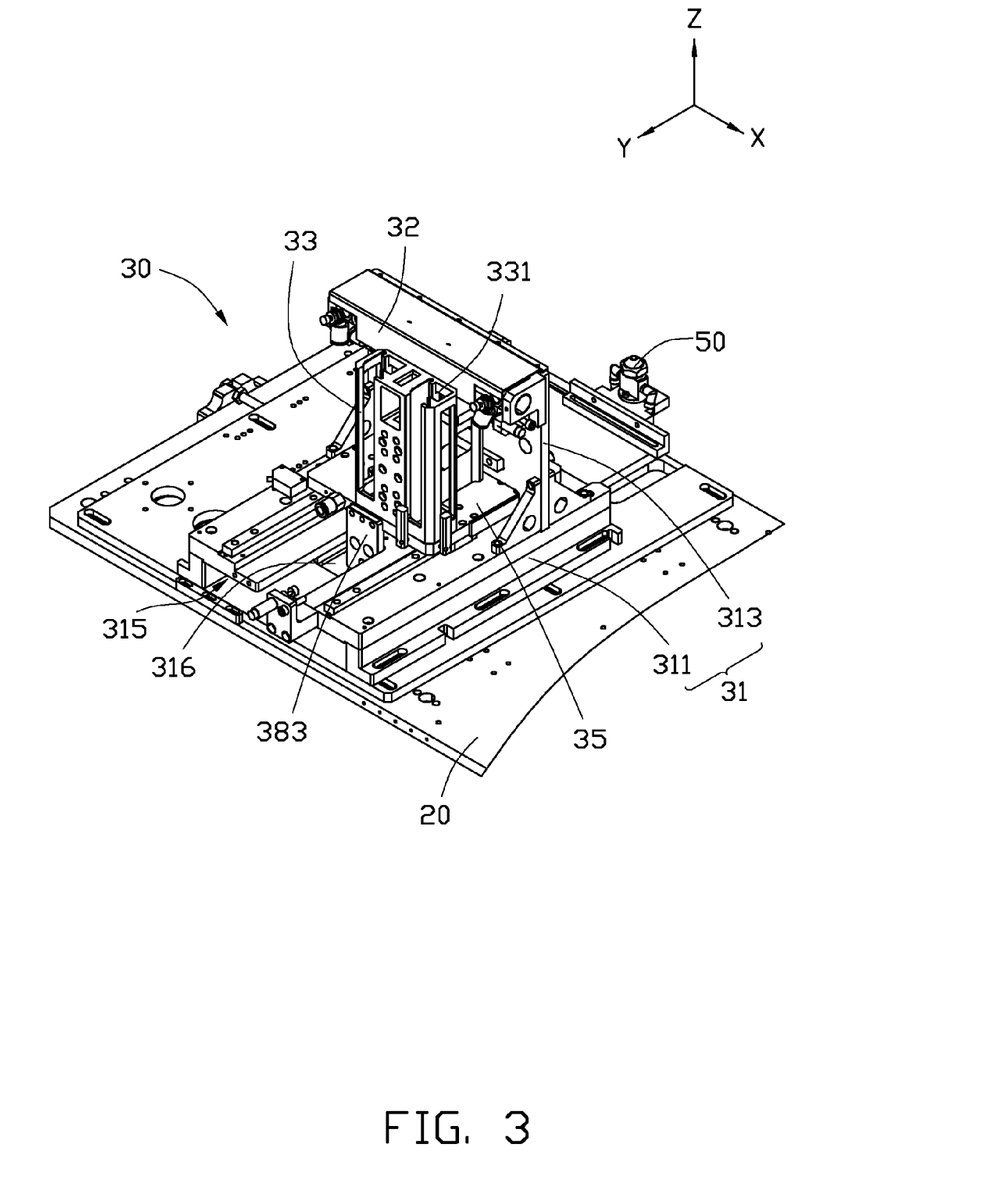
FIG. 3 is an assembled, isometric view of the second feeding mechanism shown in FIG. 1.
Figure 4:
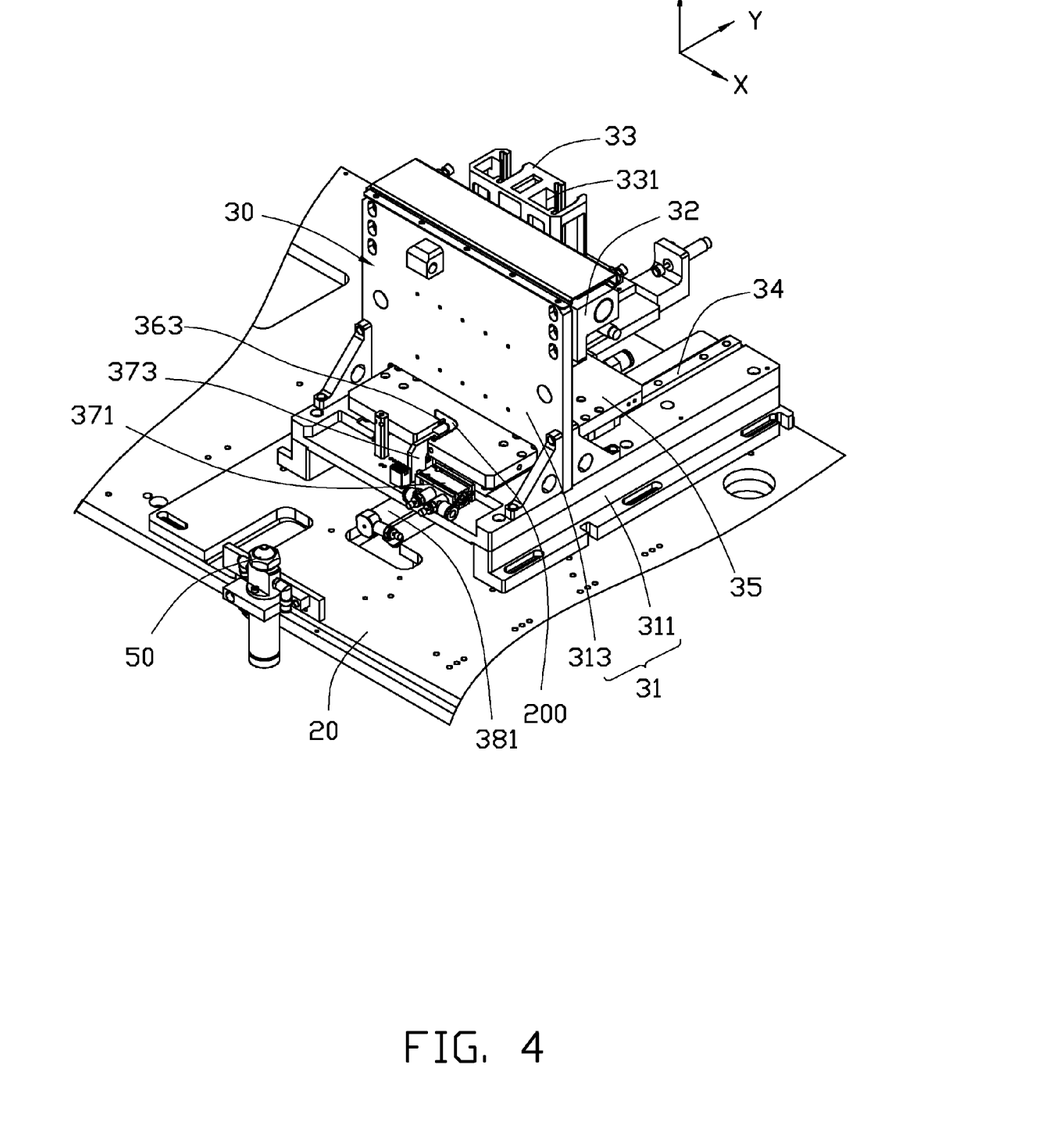
FIG. 4 is similar to FIG. 3, but viewed in another aspect.
Figure 5:
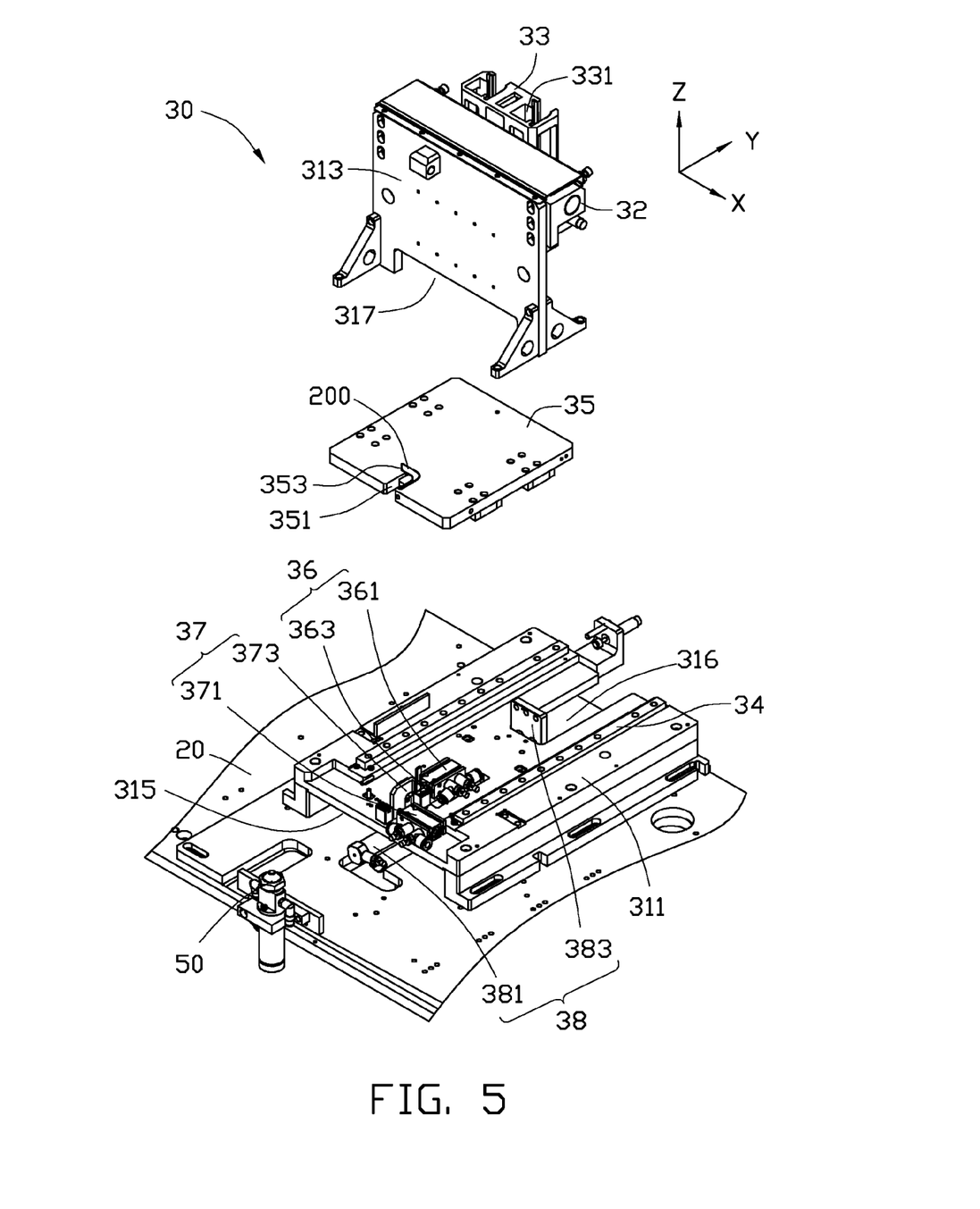
FIG. 5 is an exploded, isometric view of the second feeding mechanism shown in FIG. 4.

The horizontal driving member 32 is mounted on a top end of the second support portion 313 along the direction X, and is positioned at a side of the second support portion 313 away from the first feeding mechanism 10. The feeding member 33 is positioned on the horizontal driving member 32 along the direction Z. The horizontal driving member 32 moves the feeding member 33 along the direction X. The feeding member 33 defines two feeding grooves 331 along the direction Z, for receiving a plurality of first workpieces 200 that are being stacked.

The pair of guiding rails 34 are spaced apart and mounted on the first support portion 311 along the direction Y, and the pair of guiding rails 34 are inserted through the opening 317 of the second support portion 313. The guiding rails 34 are positioned at opposite sides of the sliding groove 316, and are parallel to each other. The positioning plate 35 is inserted through the opening 317, mounted on the pair of guiding rails 34, and being parallel to the mounting platform 20. The positioning plate 35 defines a positioning groove 351 and a matching groove 353 communicating with the positioning groove 351 at a side adjacent to the first feeding mechanism 10. The positioning groove 351 is located at a side of the matching groove 353, which is closer to the first feeding mechanism 10 than to the matching groove 353. A shape of the matching groove 353 matches with a shape of the first workpiece 200, for receiving the first workpiece 200. The positioning groove 351 is a through groove, for allowing the second positioning member 36 and the third positioning member 37 to pass through.

The second positioning member 36 and the third positioning member 37 are positioned on the first support portion 311, and are positioned between the first support portion 311 and the positioning plate 35. The second positioning member 36 includes a second driving body 361 and a second positioning end 363 connected to the second driving body 361. The second driving body 361 is positioned on the first support portion 311 along the direction Y. The second positioning end 363 is vertically mounted on the second driving body 361, and corresponds to the positioning groove 351, for positioning the first workpiece 200 in the matching groove 353. The second driving body 361 drives the second positioning end 363 to move in the positioning groove 351 along the direction Y, such that the second positioning end 363 positions the first workpiece 200 in the direction Y. The third positioning member 37 includes a third driving body 371 and a third positioning end 373 connected to the third driving body 371. The third driving body 371 is positioned on the first support portion 311 along the direction X. The third positioning end 373 is vertically mounted on the third driving body 371, and corresponds to the positioning groove 351, for positioning the first workpiece 200. The third driving body 371 drives the third positioning end 373 to move in the positioning groove 351 along the direction X, such that the third positioning end 373 positions the first workpiece 200 in the direction X.

The first driver 38 is mounted on the mounting platform 20 along the direction Y, and is received in the receiving room 315. The first driver 38 includes a driving portion 381 and a connecting portion 383 protruding from an end of the driving portion 381 away from the first feeding mechanism 10. The driving portion 381 is mounted on the mounting platform 20 along the direction Y, and an end of the driving portion 381 away from the first feeding mechanism 10 extends to the sliding groove 316. The connecting portion 383 protrudes from an end of the driving portion 381 adjacent to the sliding groove 316, and is inserted through the sliding groove 316 and connected to the positioning plate 35. The driving portion 381 moves the connecting portion 383 and the positioning plate 35 along the sliding groove 316. In the illustrated embodiment, the horizontal driving member 32, the first driver 38, the second driving body 361, and the third driving body 371 are cylinders.

The glue spraying mechanism 50 is mounted on the mounting platform 20, and is positioned between the positioning plate 35 and the first feeding mechanism 10. An imaginary line connecting the glue spraying mechanism 50 and the matching groove 353 is parallel to the direction Y.

Figure 6:
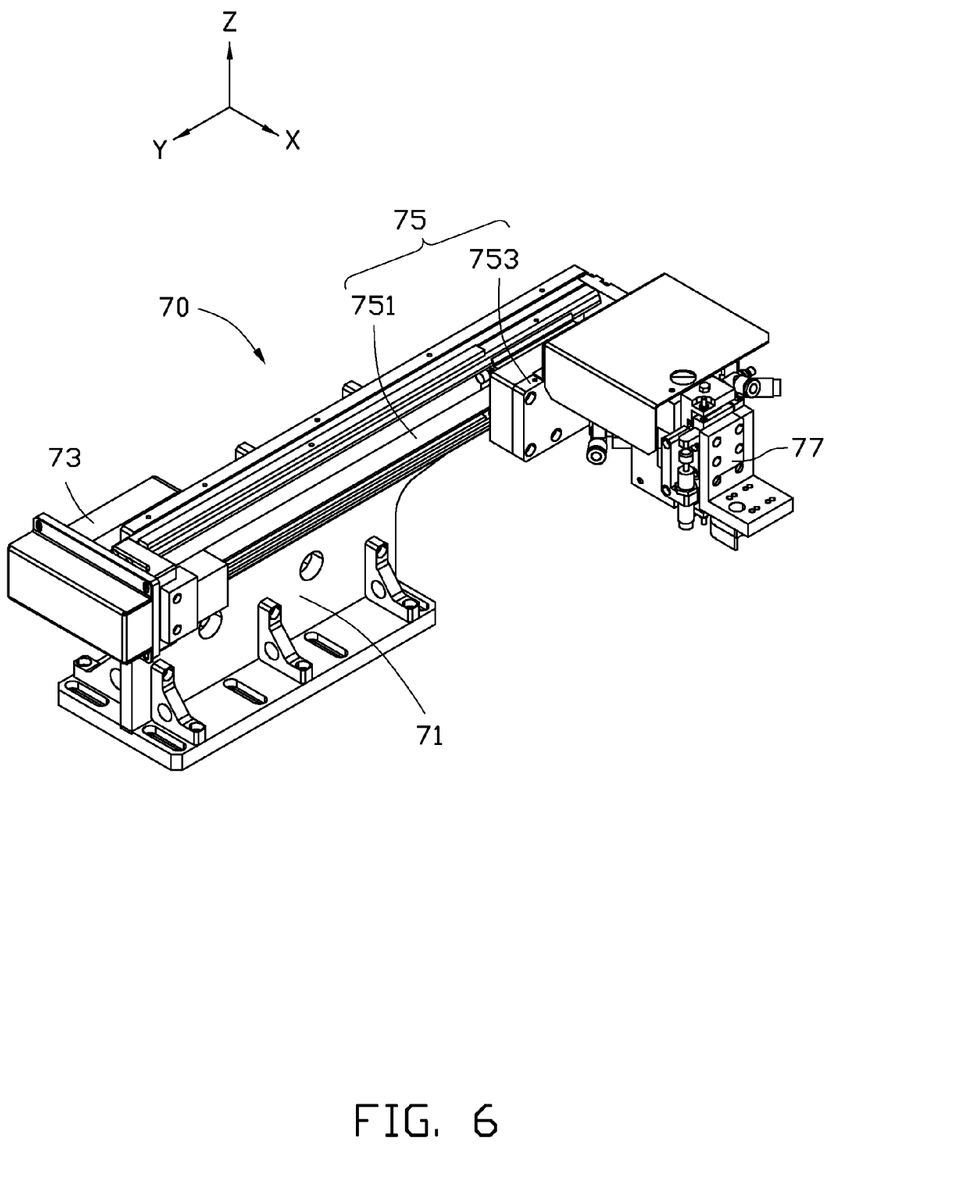
FIG. 6 is an assembled, isometric view of the bonding mechanism shown in FIG. 1.

FIG. 6 shows the bonding mechanism 70 including a base 71, a second driver 73, a lead screw 75, and a suction member 77. The base 71 is mounted on the mounting platform 20 along the direction Y, and is positioned at a same side of the first feeding mechanism 10, the second feeding mechanism 30, and the glue spraying mechanism 50. The second driver 73 is mounted at an end of the base 71. The lead screw 75 includes a guiding portion 751 and a sliding portion 753 slidable along the guiding portion 751. The guiding portion 751 is positioned on the base 71 along the direction Y, and an end thereof is connected to the second driver 73. The sliding portion 753 is sleeved on the guiding portion 751, and is screw-threadly fitted with the guiding portion 751. The second driver 73 rotates the guiding portion 751, such that the sliding portion 753 slides along the guiding portion 751. The suction member 77 is mounted on the sliding portion 753, for suctioningly-adhere onto the first workpiece 200. In the illustrated embodiment, the suction member 77 is a pneumatic suction module. In other alternative embodiments, the suction member 77 may be other suction units or modules, such as magnetic suction unit, for example.

In assembly, the motor 12 is mounted to the mounting frame 11, and the transmission belt 13 is wound on the mounting frame 11. The fixing frame 14 is received in the mounting frame 11. The guiding member 15 movably passes through the fixing frame 14. The positioning tool 16 is positioned on the fixing frame 14; and the first positioning member 17, the pressing members 18, and the resisting block 19 are mounted on the mounting frame 11, respectively. The mounting platform 20 is positioned at a side of the mounting frame 11. The support frame 31 is fixed to the mounting platform 20. The feeding member 33 is mounted to the second support portion 313 of the support frame 31 by the horizontal driving member 32. The positioning plate 35 is movably mounted to the first support portion 311 of the support frame 31 by the pair of guiding rails 34. The second positioning member 36 and the third positioning member 37 are mounted on the first support portion 311, and positioned between the first support portion 311 and the positioning plate 35. The first driver 38 is mounted on the mounting platform 20, and the connecting portion 383 of the first driver 38 is connected to the positioning plate 35. The glue spraying mechanism 50 is positioned between the mounting frame 11 and the support frame 31. The base 71 is positioned on the mounting platform 20, and the second driver 73 is mounted to the base 71. The lead screw 75 is mounted on the base 71, and is connected to the second driver 73. The suction member 77 is mounted to the sliding portion 753 of the lead screw 75.

In use, a plurality of first workpiece 200 are stacked and received in the feeding grooves 331. The first driver 38 drives the positioning plate 35 to move until the matching groove 353 is aligned to the feeding groove 331. The bottom one of the stacked plurality of first workpieces 200 is gravity-dropped to the matching groove 353 from the feeding groove 331. The first driver 38 drives the positioning plate 35 to move until the second positioning end 363 of the second positioning member 36 and the third positioning end 373 of the third positioning member 37 are received in the positioning groove 351. The second driving body 361 moves the second positioning end 363 along the direction Y, to position the first workpiece 200 received in the matching groove 353 in the direction Y. The third driving body 371 moves the third positioning end 373 along the direction X, to position the first workpiece 200 received in the matching groove 353 in the direction X. At the same time, the second workpiece 300 is conveyed on the transmission belt 13 until being blocked by the resisting block 19. Then, the telescopic driver 131 moves the fixing frame 14 vertically along the guiding member 15, and the positioning tool 16 receives and pushes the second workpiece 300, thereby detaching the second workpiece 300 from the transmission belt 13. The pressing members 18 press the second workpiece 300, to position the second workpiece 300 in the direction Z. The first driving body 171 drives first positioning end 173 to move along the opposite direction from the direction X, and positions the second workpiece 300 in the direction X cooperating with the resisting block 19. Then, the suction member 77 absorbs or suctioningly holds the first workpiece 200 received in the matching groove 353. The second driver 73 rotates the guiding portion 751 of the lead screw 75, such that the suction member 77 and the sliding portion 753 move along the guiding portion 751 until the first workpiece 200 reaches the glue spraying mechanism 50. The glue spraying mechanism 50 sprays glue to the first workpiece 200, and the second driver 73 continues to move the suction member 77 until reaching the second workpiece 300. The suction member 77 bonds the first workpiece 200 to the second workpiece 300. When the suction member 77 absorbs the first workpiece 200, another first workpiece 200 is fed simultaneously. When the first workpieces 200 that are received in one feeding groove 331 are used up, the horizontal driving member 32 moves the feeding member 33 until another feeding groove 331 aligns to the matching groove 353, which is convenient for supplying the first workpieces 200 in a timely manner.

The first workpiece 200 and the second workpiece 300 are fed automatically, and the second driver 73 drives the suction member 77 to move from the positioning plate 35 to the transmission belt 13, and to breaking to a stop when the suction member 77 reaches the glue spraying mechanism 50, and the first workpiece 200 are automatically bonded with the second workpiece 300, thus thereby saving a large amount of human labor and time. A bonding cost of the workpieces together is low. Because the first workpiece 200 automatically bonds with the second workpiece 300. a bonding accuracy is improved.

In an alternative embodiment, the lead screw 75 can be omitted, and then the suction member 77 are directly connected to the second driver 73, and the second driver 73 can be a cylinder which linearly moves the suction member 77. When more than one first workpiece 200 needs to be bonded to the second workpiece 300, more than one second feeding mechanism 30, more than one glue spraying mechanism 50, and more than one bonding mechanism 70 may be positioned around the first feeding mechanism 10, thus simultaneously bonding more than one first workpiece 200 to the second workpiece 300.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A bonding device, for bonding a first workpiece to a second workpiece, comprising:
    a first feeding mechanism comprising a mounting frame and a transmission belt mounted on the mounting frame, for feeding the second workpiece;
    a second feeding mechanism for feeding the first workpiece, and comprising:
        a support frame,
        a feeding member positioned on the support frame, and vertically defining at least one feeding groove for receiving a plurality of first workpieces,
        a positioning plate mounted on the support frame, and located below the feeding member, the positioning plate defining a matching groove matching with the first workpiece, and
        a first driver connected to the positioning plate for driving the positioning plate;
    a glue spraying mechanism positioned between the mounting frame and the support frame; and
    a bonding mechanism comprising a second driver and a suction member connected to and driven by the second driver,
    wherein the support frame comprises a first support portion and a second support portion perpendicular to the first support portion, the positioning plate is mounted on the first support portion, and the feeding member is mounted on the second support portion; and
    wherein when one of the plurality of the first workpieces drops into the matching groove from the at least one feeding groove, the first driver is capable of driving the positioning plate to move away from the feeding member, the suction member is capable of suctioning the first workpiece received in the matching groove, the second driver is capable of moving the suction member and the first workpiece to the glue spraying mechanism, the glue spraying mechanism is capable of spraying glue to the first workpiece held by the suction member, the second driver is capable of continually moving the first workpiece to the second workpiece and bonding the first workpiece with the second workpiece.

2. The bonding device of claim 1, wherein the first feeding mechanism further comprising a telescopic driver, a fixing frame, a guiding member, a positioning tool, and a resisting block, the telescopic driver and the fixing frame are received in the mounting frame, the fixing frame is positioned above the telescopic driver, the guiding member is vertically and movably inserted through the fixing frame, the positioning tool is positioned on the fixing frame, the resisting block is mounted on the mounting frame and located besides and above the positioning tool, the transmission belt is capable of transporting the second workpiece above the positioning tool, and the resisting block blocks the second workpiece, the telescopic driver is capable of moving the fixing frame and the positioning tool along the guiding member, thereby pushing the second workpiece to detach away from the transmission belt.

3. The bonding device of claim 2, wherein the first feeding mechanism further comprises a first positioning member and a pressing member, the first positioning member comprises a first driving body mounted on the mounting frame and a first positioning end connected to the first driving body, the pressing member is mounted on the mounting frame, and is positioned above the positioning tool, when the telescopic driver moves the fixing frame, the pressing member presses the second workpiece received in the positioning tool, and the first driving body moves the first positioning end to position the second workpiece along a direction perpendicular to the pressing member.

4. The bonding device of claim 1, wherein the second feeding mechanism further comprises a horizontal driving member mounted on the second support portion, the feeding member is located on the horizontal driving member, the at least one feeding groove comprises two feeding grooves, the two feeding grooves are defines vertically, the horizontal driving member is capable of moving the feeding member horizontally, to switch between different feeding grooves to align with the matching groove.

5. The bonding device of claim 1, wherein the second feeding mechanism further comprises a guiding rail mounted on the first support portion, the second support portion defines an opening at an end thereof adjacent to the first support portion, the guiding rail is inserted through the opening, the positioning plate is movably mounted on the guiding rail.

6. The bonding device of claim 5, wherein the second feeding mechanism further comprises a second positioning member and a third positioning member, the positioning plate further defines a positioning groove communicating with the matching groove, the second positioning member comprises a second driving body and a second driving end connected to the second driving body, the third positioning member comprises a third driving body and a third positioning end connected to the third driving body, the first driver is capable of moving the positioning plate until the second positioning end and the third positioning end are receiving in the positioning groove, the second driving body drives the second positioning end to position the first workpiece received in the matching groove along a first direction, the third driving body drive the third positioning end to position the first workpiece received in the matching groove along a second direction different from the first direction.

7. The bonding device of claim 1 further comprising a mounting platform, wherein the first support portion is mounted on the mounting platform, the first support portion and the mounting platform defines a receiving room cooperatively, the first driver is mounted on the mounting platform, and received in the receiving room, the glue spraying mechanism is mounted on the mounting platform.

8. The bonding device of claim 7, wherein the first driver comprises a driving portion and a connecting portion protruding from the driving portion, the first support portion defines a sliding groove, the connecting portion is inserted through the sliding groove and connected to the positioning plate.

9. The bonding device of claim 1, wherein the bonding mechanism further comprises a base and a lead screw, the base is positioned at a same side of the first feeding mechanism, the second feeding mechanism, and the glue spraying mechanism, the second driver is mounted at an end of the base, the lead screw comprises a guiding portion and a sliding portion slidably sleeved on the guiding portion, the suction member is mounted on the sliding portion, the second driver is capable of rotating the guiding portion, and thereby enabling the sliding portion and the suction member moving along the guiding portion.

10. A bonding device, for bonding a first workpiece to a second workpiece, comprising:
a first feeding mechanism comprising a mounting frame and a transmission belt mounted on the mounting frame, the transmission belt capable of transmitting the second workpiece;
a second feeding mechanism comprising:
a support frame,
a feeding member positioned on the support frame, and vertically defining at least one feeding groove for receiving a plurality of first workpieces,
a positioning plate mounted on the support frame, and located below the feeding member, the positioning plate defining a matching groove matching with the first workpiece, and
a first driver connected to the positioning plate, and capable of moving the positioning plate towards the at least one feeding groove until the at least one feeding groove being aligned to the matching groove, and capable of moving the positioning plate away from the at least one feeding groove;
a glue spraying mechanism positioned between the mounting frame and the support frame; and
a bonding mechanism comprising a second driver and a suction member connected to the second driver, the second driver is capable of driving the suction member to move from the positioning plate to the transmission belt, and capable of breaking to a stop when the suction member reaching to the glue spraying mechanism;
wherein the support frame comprises a first support portion and a second support portion perpendicular to the first support portion, the positioning plate is mounted on the first support portion, and the feeding member is mounted on the second support portion.

11. The bonding device of claim 1, wherein the first feeding mechanism further comprising a telescopic driver and a fixing frame, the telescopic driver and the fixing frame are received in the mounting frame, the fixing frame is positioned above the telescopic driver and positioned below the transmission belt, the telescopic driver is capable of moving the fixing frame vertically.

12. The bonding device of claim 11, wherein the first feeding mechanism further comprises a guiding member, a positioning tool, and a resisting block, the guiding member is vertically and movably inserted through the fixing frame, the positioning tool is positioned on the fixing frame, the resisting block is mounted on the mounting frame and located besides and above the positioning tool, the resisting block is capable of blocking the second workpiece.

13. The bonding device of claim 12, wherein the first feeding mechanism further comprises a first positioning member and a pressing member, the first position member comprises a first driving body mounted on the mounting frame and a first positioning end connected to the first driving body, the pressing member is mounted on the mounting frame, and is positioned above the positioning tool, when the telescopic driver moving the fixing frame, the pressing member vertically presses the second workpiece received in the positioning tool, and the first driving body moves the first positioning end to horizontally position the second workpiece.

14. The bonding device of claim 10, wherein the second feeding mechanism further comprises a horizontal driving member mounted on the second support portion, the feeding member is located on the horizontal driving member, the at least one feeding groove comprises two feeding grooves, the two feeding grooves are defines vertically, the horizontal driving member is capable of moving the feeding member horizontally, to switch between different feeding grooves to align with the matching groove.

15. The bonding device of claim 10, wherein the second feeding mechanism further comprises a guiding rail mounted on the first support portion, the second support portion defines an opening at an end thereof adjacent to the first support portion, the guiding rail is inserted through the opening, the positioning plate is movably mounted on the guiding rail.

16. The bonding device of claim 15, wherein the second feeding mechanism further comprises a second positioning member and a third positioning member, the positioning plate further defines a positioning groove communicating with the matching groove, the second positioning member comprises a second driving body and a second driving end connected to the second driving body, the third positioning member comprises a third driving body and a third positioning end connected to the third driving body, the first driver is capable of moving the positioning plate until the second positioning end and the third positioning end are receiving in the positioning groove, the second driving body drives the second positioning end to position the first workpiece received in the matching groove along a first direction, the third driving body drive the third positioning end to position the first workpiece received in the matching groove along a second direction different from the first direction.

17. The bonding device of claim 10 further comprising a mounting platform, wherein the first support portion is mounted on the mounting platform, the first support portion and the mounting platform defines a receiving room cooperatively, the first driver is mounted on the mounting platform, and received in the receiving room, the glue spraying mechanism is mounted on the mounting platform.

18. The bonding device of claim 17, wherein the first driver comprises a driving portion and a connecting portion protruding from the driving portion, the first support portion defines a sliding groove, the connecting portion is inserted through the sliding groove, and connected to the positioning plate.

* * * * *